United States Patent [19]

Falckenberg et al.

[11] Patent Number: 4,913,199

[45] Date of Patent: Apr. 3, 1990

[54] ARRANGEMENT FOR THE COMPLETE EMPTYING OF QUARTZ TANKS OR CRUCIBLES FILLED WITH A SILICON MELT FOLLOWING SILICON BAND DRAWING

[75] Inventors: Richard Falckenberg, Wald; Gerhard Hoyler; Bernhard Freienstein, both of Munich; Josef Grabmaier, Berg, all of Fed. Rep. of Germany

[73] Assignee: Siemens Aktiengesellschaft, Berlin and Munich, Fed. Rep. of Germany

[21] Appl. No.: 288,855

[22] Filed: Dec. 23, 1988

[30] Foreign Application Priority Data

Feb. 25, 1988 [DE] Fed. Rep. of Germany ....... 3806001

[51] Int. Cl.$^4$ .............................................. B01D 9/00
[52] U.S. Cl. ........................................ 141/98; 141/65; 141/82; 422/249; 239/379; 239/38; 156/DIG. 64; 156/DIG. 97
[58] Field of Search .................... 141/1, 98, 65, 31, 82; 156/605, 608, DIG. 64, DIG. 97, DIG. 88, 620.1, 620.71; 422/247, 248, 249; 239/37, 38, 279

[56] References Cited

U.S. PATENT DOCUMENTS

| | | | |
|---|---|---|---|
| 4,226,834 | 10/1980 | Shudo et al. | 422/249 |
| 4,289,571 | 9/1981 | Jewett | 422/249 |
| 4,563,976 | 1/1986 | Foell et al. | 422/249 |
| 4,822,585 | 4/1989 | Dawless | 156/DIG. 64 |

FOREIGN PATENT DOCUMENTS

| | | |
|---|---|---|
| 0170119 | 7/1984 | European Pat. Off. . |
| 3026030 | 1/1981 | Fed. Rep. of Germany . |
| 3217686 | 11/1983 | Fed. Rep. of Germany . |

OTHER PUBLICATIONS

C. A. Rhodes et al., "Investigation of the Meniscus Stability in Horizontal Crystal Ribbon Growth", Journal of Crystal Growth 50 (1980) pp. 94–101.

*Primary Examiner*—Ernest G. Cusick
*Attorney, Agent, or Firm*—Hill, Van Santen, Steadman & Simpson

[57] ABSTRACT

A method and device for the complete emptying of flat quartz tanks or crucibles filled with silicon melt is provided. The apparatus includes an open outlet nozzle located in a floor of the tank and a tube-shaped, rod-shaped, or channel-shaped member composed of a material that is well-wettable by silicon melt that is brought into contact with the outlet nozzle after the conclusion of the drawing process. The member is in fluid communication with a collecting vessel. The outlet nozzle is so constructed and arranged that the silicon melt adjacent at the nozzle aperture is prevented from running out during the band drawing due to the curvature pressure of its downwardly, convexly arced surface. The apparatus can be used in continuous, horizontal band-drawing of silicon for solar cells.

6 Claims, 2 Drawing Sheets

ARRANGEMENT FOR THE COMPLETE EMPTYING OF QUARTZ TANKS OR CRUCIBLES FILLED WITH A SILICON MELT FOLLOWING SILICON BAND DRAWING

BACKGROUND OF THE INVENTION

The present invention is directed to an arrangement for the complete emptying of flat quartz tanks, or crucibles, filled with silicon melt, as used for the continuous, horizontal band drawing of silicon bands wherein carrier members contact the melt surface.

An example of a horizontal band drawing method is disclosed in European Patent Application No. 170 119. This method is referred to as the S-web, or supported web, method. By use of this method, silicon bands for solar cells can be produced continuously from a silicon melt with a high drawing speed (approximately 1 m/min).

Pursuant to this method, the silicon melt is located in a first flat, roughly rectangular, quartz tank having, for example, a length of 70 cm, a width of 15 cm, and a height of 1 cm. Another flat quartz tank, or crucible is connected to the first tank, that houses the silicon melt, by way of a connecting tube. The second quartz tank functions to melt silicon so that melted silicon is constantly available. During the duration of the process, the height of the silicon melt in the quartz tanks is approximately at a maximum of approximately 3 cm, and preferably 1 to about 2 cm.

After the conclusion of the drawing process, a residual melt having, for example, a height of 0.5 to 1.0 cm remains in the quartz tanks and in t he connecting tube. Because these quartz tanks are seated in supporting tanks of graphite that are surrounded by thermal insulation and heating devices, it is not possible to empty the silicon residue in the tanks by simply tipping the quartz tanks on their sides. It is, however, necessary to remove the residue silicon. When heat is no longer supplied to the tanks, the residual melt that remains therein, solidifies in the tanks and, due to the different dimensional changes of quartz and silicon, destroys the quartz vessels as it cools.

One possible method of removing the residual melt from the tanks or crucibles is to try to absorb the residual melt into carbon wool. This type of removable, however, is extremely involved and is not especially economical. Moreover, this method can lead to the contamination of the quartz vessels with carbon.

SUMMARY OF THE INVENTION

The present invention provides an apparatus that not only operates efficiently to create silicon bands, but also provides for a simple, and complete emptying of the melt vessels.

To this end, the present invention provides an apparatus for the complete emptying of flat quartz tanks, or crucibles, that are filled with silicon melt, as used for the continuous, horizontal band drawing of silicon bands wherein carrier members contact the melt surface. The apparatus includes an open outlet nozzle located in a floor of the tank, or crucible. The outlet nozzle includes an aperture and is so constructed and arranged that the silicon melt near the nozzle aperture is prevented from running out of the nozzle during the tape drawing process due to the curvature pressure of the melt's downwardly, convexly arced surface.

To remove the silicon melt after the drawing process, a tube-shaped, rod-shaped, or channel-shaped member that is in communication with a collecting vessel and is well-wettable by silicon melt yet resistant to silicon, is provided. The tube, rod, or channel-shaped member is positioned at the nozzle aperture after the conclusion of the drawing process and removes the residue melt.

In an embodiment of the present invention, the open outlet nozzle is located at a lowest point of the floor of the tank or crucible.

In an embodiment of the present invention, the diameter d of the nozzle aperture is calculated via the relationship between the height h of the melt above the nozzle aperture and the diameter d of the nozzle aperture according to the formula:

$$h = \frac{4\sigma}{\rho \cdot g \cdot d} \text{ (mm}^2\text{)}$$

wherein: $\sigma$ is the surface tension of molten silicon at the melting temperature (=720 g/s$^2$); $\rho$ is the density of the silicon melt at a given height h; and g is the acceleration due to gravity (=981 cm/s$^2$). In a further embodiment, the diameter d is set at less than 3.3 mm given a melt height h of 35 mm.

In an embodiment of the present invention, the tube-shaped, rod-shaped or channel-shaped member is composed of graphite having a high densitY and a low porosity.

In an embodiment of the present invention, the tube-shaped or channel-shaped member is composed of a material that is shape-stable in the face of the silicon melt and includes a coating of silicon carbide.

In an embodiment of the present invention, means are provided with which the tube-shaped, rod-shaped, or channel-shaped member and the collecting vessel are maintained at a temperature that is above the melting temperature of silicon.

A method of emptying the vessels of residue silicon melt is also provided.

Additional features and advantages of the present invention will be apparent from the detailed description of the presently preferred embodiments and from the drawings.

DETAILED DESCRIPTION OF THE PRESENTLY PREFERRED EMBODIMENTS

The present invention provides an apparatus for the horizontal drawing of silicon that provides means for a complete emptying of the tanks or crucibles. A method of emptying the tanks or crucibles is also provided.

Figure 1:
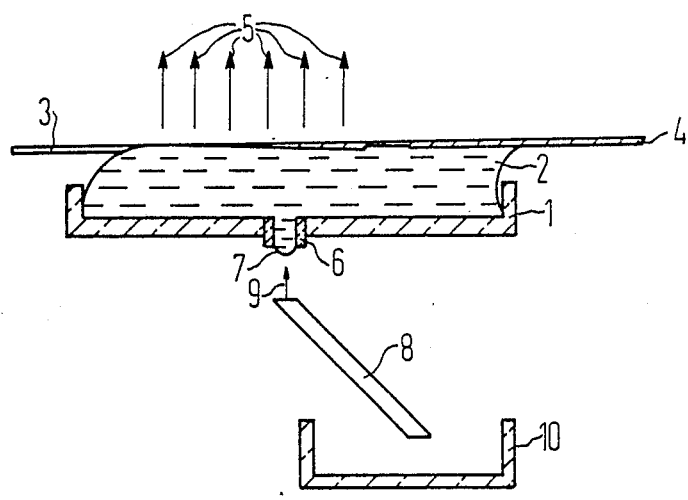
FIG. 1 illustrates a schematic view of an embodiment of the apparatus for continuously drawing silicon bands of the present invention.

Referring to FIG. 1, there is illustrated, generally, a continuously operating tape-drawing apparatus according to what is referred to as the S-web method as also disclosed, for example, in European Patent Application No. 0 170 119. For the sake of greater clarity, specific details such as the heaters, reflectors, replenishing means, etc., are not illustrated in FIG. 1.

As illustrated, a melt tank 1 of quartz in which the silicon melt 2 is situated is used for the horizontal drawing process. A band 3 composed of a carbon fiber network is continuously drawn across the surface of the melt 2. The carbon fiber network 3 serves as a carrier member. To this end, the carbon fiber network 3 comprises nucleation centers that cause the silicon to begin crystallizing as a result of contact of the carbon fiber 3 with the surface of the silicon melt 2.

A finished, crystalline band is illustrated in FIG. 1 as 4. Numeral 5 indicates the emission of heat from the silicon band 4 or, respectively, from the melt 2.

Pursuant to the present invention, the quartz tank 1 includes an open outlet nozzle 6 of quartz. In the embodiment of the present invention illustrated, the open outlet nozzle 6 is located at the lowest point in the floor of the quartz tank 1. The diameter d of the aperture of the nozzle 6 is dimensioned such that the silicon melt 2 near the nozzle aperture, during the tape drawing process, is prevented from running out due to the curvature pressure of the silicon's downwardly, convexly arced surface 7.

The present invention also provides a tube member 8, that can be a small graphite tube, graphite rod, or graphite channel, that functions to remove the residue silicon melt after the drawing process. To this end, after the conclusion of the drawing process, when it is desired to empty the residual melt, the tube member 8 is brought into contact with the silicon melt 7 located at the aperture of the outlet nozzle 8 (see arrow 9). The tube member 8 is constructed so that it is well-wetted by the molten silicon 2. The tube member 8 functions to conduct the silicon melt 2 vertically or obliquely down into a collecting vessel 10.

Figure 2:
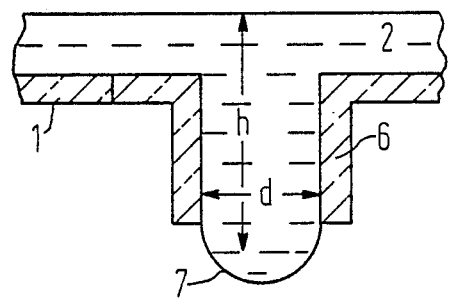
FIG. 2 illustrates an enlarged cross-sectional view of the outlet nozzle of the apparatus illustrated in FIG. 1.

Referring now to FIG. 2, the present invention utilizes an equilibrium condition between the curvature pressure of a convexly arced surface of a liquid and the hydrostatic pressure of the liquid that is due to the force of gravity. Reference numeral 7 refers to the surface of the drop of silicon extending from the outlet nozzle 6. Assuming h is the height of the silicon melt 2 in the crucible 1 above an imaginary, center plane in the drop 7, according to Laplace's First Law (cf., for example, *Lehrbuch der Experimental Physik*, Volume I, 9th edition, page 405, Berlin/New York 1987), the shape of the surface 7 of the drop is determined in that the curvature pressure $P_K$ at every point of the drop surface is:

$$P_K = \sigma \left( \frac{1}{r_1} + \frac{1}{r_2} \right) \quad (1)$$

wherein: $\sigma$ is the surface tension of the silicon melt; and $r_1$ and $r_2$ are the two main curvature radii of the surface at this point.

For small diameters d, less than approximately 10 mm, of the outlet nozzle, the drop surface can be approximated by a spherical surface with $r_1 = r_2 = r$. This results in:

$$P_K = \frac{2\sigma}{r} \quad (2)$$

In the equilibrium condition, the curvature pressure $P_K$ is equal to the hydrostatic pressure $P_H$ of the silicon melt having the height h. $P_H$ is determined by:

$$P_H = \rho g h \quad (3)$$

wherein: $\rho$ = density of the silicon melt; and g = the acceleration due to gravity.

Following from $P_K = P_H$ is that the defined curvature radius r $$r = \frac{2\sigma}{\rho g h} \quad (4)$$

belongs to every melt height h. Whether or not this curvature radius can be established at the nozzle aperture depends on the diameter d of the nozzle aperture and on the wetting angle $\epsilon$ between the liquid and the nozzle material.

Figure 3:
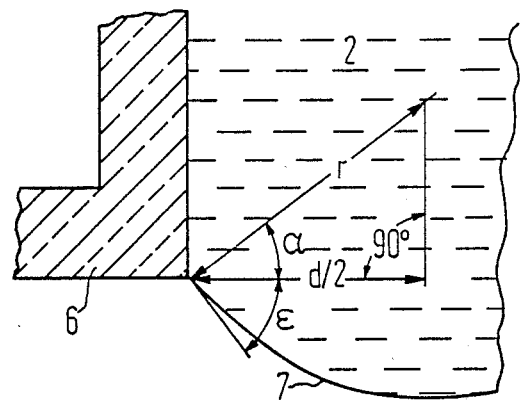
FIG. 3 illustrates an enlarged cross-sectional view of a part of the aperture of the outlet nozzle illustrated in FIG. 2.

FIG. 3 illustrates a portion of the aperture of the outlet nozzle 6. FIG. 3 specifically illustrates a beginning point of the liquid drop 7 in a greatly enlarged view. The angle that the tangential surface at the drop surface 7 forms with the lower nozzle face 6 upon contact, is the wetting angle $\epsilon$, a material constant. As FIG. 3 illustrates, the relationship $$\frac{d/2}{r} = \cos \alpha = \cos(90° - \epsilon) \quad (5)$$

or $$r = \frac{d/2}{\cos(90° - \epsilon)}$$

must be met between the curvature radius r of the drop surface 7 and the diameter d of the nozzle 6.

This relationship was derived under the condition that the drop 7 forms its wetting angle with the horizontal nozzle limitation 6: such a drop exhibits the greatest curvature that can form at the end of the outlet nozzle. Flatter curvatures and, thus, a larger r are possible because the drop then creates its wetting angle at a rectangular edge of the outlet nozzle. One can envision that this edge in a microscopic view has a semicircular arc to which flatter curvatures can attach upon retention of the wetting angle $\epsilon$.

Through the use of Equation (5), a maximum height h of the silicon melt of $$h = \frac{4\sigma}{\rho g d} \cos(90° - \epsilon) \quad (6)$$

can be calculated with a given d and $\epsilon$ in combination with Eq. (4), as is a smallest curvature radius of the drop surface. For the quartz and molten silicon, $\epsilon$ is very close to 90°, as derives from a report by Rhodes, C. A., et al, "Investigation Of The Meniscus Stability In Horizontal Crystal Ribbon Growth", J. Crystal Growth 50(1980), pages 94 to 101, i.e., $$h = \frac{4\sigma}{\rho g d} \quad (7)$$

Figure 4:
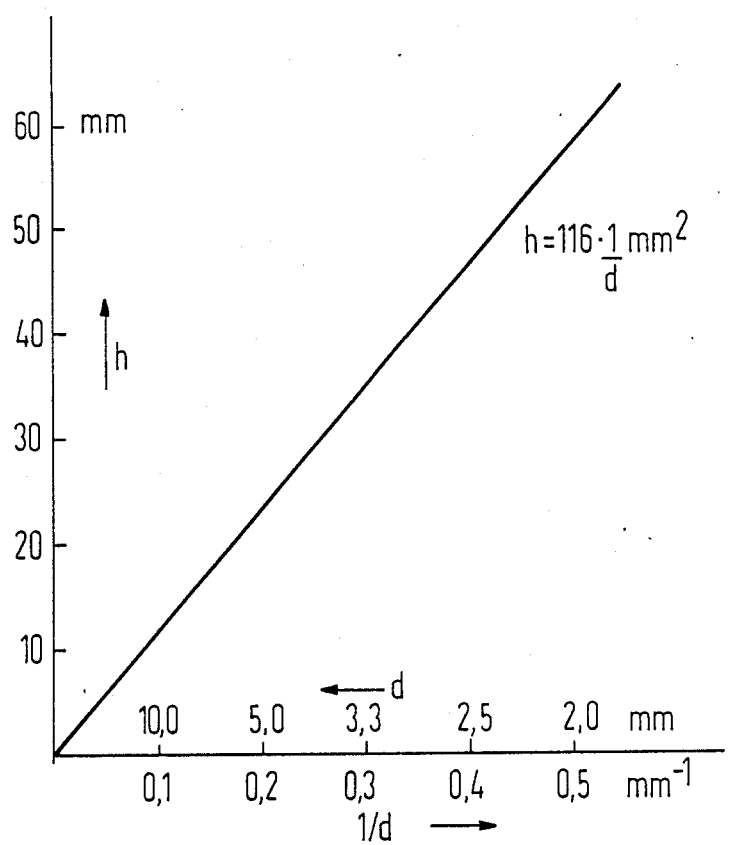
FIG. 4 illustrates a graph for calculating the melt height h or, respectively, the diameter d of the aperture of the outlet nozzle.

Referring now to FIG. 4, the surface tension $\sigma$ of molten silicon at its melting temperature is set forth as 720 g/s$^2$ in the report of Rhodes and $\rho$ is 2.53 g/cm$^3$. When these values, as well as g = 981 cm/s$^2$, are inserted into Equation (7), the relationship of h to d can be calculated as illustrated in FIG. 4.

In order to prevent a run-out of the melt having a height h during operation the diameter d of the outlet nozzle should not be greater than the value of h that is determined from FIG. 4, for example, if h=35 mm, d should be less than 3.3 mm.

Experimental trials with a cylindrical quartz crucible 1 having an inside diameter of 65 mm and an outlet nozzle 6 centrally located in the floor and having an inside diameter of 2 mm and a length of 15 mm demonstrated that silicon did not run out given a height h of the silicon melt of 57 mm (measured from the aperture of the outlet nozzle 6 up to the melt surface 2 in the crucible 1). This experimental finding confirms the theoretical curve set forth in FIG. 4.

As previously stated, the tube member 8, for emptying the silicon 2, that is brought into contact (9) with the drop 7 at the outlet nozzle 6 must be well-wettable by silicon. Furthermore, it should also be simultaneously resistent to molten silicon so that it retains its shape. It has been found that high-density graphite grades that have a low porosity, or parts coated with silicon carbide, are suitable therefor.

It should be noted that as long as the silicon is running off, the small graphite tube or, respectively, rod or the graphite channel 8 and the collecting vessel 10 must be held at a temperature above the melting temperature of the silicon.

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. An apparatus for the complete emptying of flat quartz tanks or crucibles filled with a silicon melt, as utilized for the continuous, horizontal band drawing of silicon bands through the contacting of carrier members with the surface of the silicon melt comprising:

an open outlet nozzle, having an aperture, located in a floor of a tank, the outlet nozzle being so constructed and arranged that the silicon melt near the aperture of the outlet nozzle does not run out of the aperture during the drawing process due to a curvature pressure of the silicon melt's downwardly, convexly arced surface; and a tube member having a channel for removing the silicon melt, the tube member is well-wettable by the silicon melt yet resistant to the silicon melt and is located at the nozzle aperture allowing the silicon melt to be collected in a vessel that is in fluid communication with the tube member.

2. The apparatus of claim 1 wherein the open outlet nozzle is located at a lowest point of the floor.

3. The apparatus of claim 1 wherein the diameter d of the aperture of the nozzle is calculated via a relationship between the height h of the melt above the aperture and the diameter d of the aperture according to:

$$h = \frac{4\sigma}{\rho \cdot g \cdot d} \text{ (mm}^2\text{)}$$

wherein: $\sigma$ is the tension of molten silicon at its melting temperature; $\rho$ is the density of the silicon melt at a given height h; and g is the acceleration due to gravity.

4. The apparatus of claim 3 wherein the diameter d is set at less than 3.3 mm given a melt height h of 35 mm.

5. The apparatus of claim 1 wherein the tube member is composed of graphite having a high density and a low porosity.

6. The apparatus of claim 1 wherein the tube member is composed of a material that will maintain its shape even when contacted by the silicon melt.

* * * * *